United States Patent

MacManus et al.

Patent Number: 4,724,601
Date of Patent: Feb. 16, 1988

[54] METHOD OF MANUFACTURING A RETURN-TO-ZERO GAUGE

[75] Inventors: Daniel C. MacManus, Owosso; David A. Ross, Columbiaville, both of Mich.

[73] Assignee: General Motors Corporation, Detroit, Mich.

[21] Appl. No.: 827,968

[22] Filed: Feb. 10, 1986

[51] Int. Cl.⁴ .............................................. H01F 7/06
[52] U.S. Cl. ................... 29/602 R; 29/606; 324/146
[58] Field of Search ............ 324/146, 144, 147, 151, 324/143; 29/602 R, 605, 606; 335/222; 116/204

[56] References Cited

U.S. PATENT DOCUMENTS

| | | | |
|---|---|---|---|
| 2,668,945 | 2/1954 | Pfeffer | 324/146 |
| 2,697,204 | 12/1954 | Otzmann, Jr. | 324/146 |
| 3,275,936 | 9/1966 | Huston | 324/146 |
| 3,753,107 | 8/1973 | Burgett et al. | 324/146 |
| 3,777,265 | 12/1973 | Void | 324/146 |
| 4,492,920 | 1/1985 | Reenstra | 324/146 |

OTHER PUBLICATIONS

Compact Air Core Gage and Stepper Motor Systems for Vehicular Instrument Panels–SAE Proceedings, Oct. 1984–Daniel MacManus and Wayne Madsen.

Primary Examiner—P. W. Echols
Attorney, Agent, or Firm—Warren D. Hill

[57] ABSTRACT

An air core electrical gauge incorporates on the bobbin an annular biasing magnet magnetized in a direction to return the meter pointer to zero in the absence of a gauge driving current. A method of manufacturing the gauge includes magnetizing the biasing magnet after it is secured to a bobbin portion but optionally magnetizing the guage armature at the same time.

3 Claims, 4 Drawing Figures

METHOD OF MANUFACTURING A RETURN-TO-ZERO GAUGE

FIELD OF THE INVENTION

This invention relates to an electrical gauge and a method of gauge manufacture, and particularly for a gauge having a return-to-zero feature.

BACKGROUND OF THE INVENTION

Electrical gauges of the type used as indicator meters in automotive vehicles frequently are driven solely by electrical signals representing the parameter being measured so that when the current is turned off, as when the vehicle ignition is off, the gauge is left to float or drift to give an indication which is not relative to the real state of the parameter. This condition is not a serious matter since the apparent misinformation occurs only when the vehicle is not operating. It is considered to be desirable, however, to positively bias the meter to a zero indication when the ignition is turned off to avoid the impression that the gauge is unreliable or that the measured parameter has the indicated value, It has been previously proposed to use a biasing magnet in a gauge to attract the magnetic armature to a zero value in the absence of signal current as indicated in the following U.S. patents. Pfeffer U.S. Pat. No. 2,668,945 uses a calibrating magnet which is adjusted by bending tabs or screw adjustment after meter assembly for each meter. Reenstra U.S. Pat. No. 4,492,920 incorporates a plurality of magnets in a bobbin to establish a restoring force to a fixed position. A compensating coil is used to counteract any effects of the magnets when signals are applied to the meter. Void U.S. Pat. No. 3,777,265 has a variable reluctance path adjusted individually by bending soft iron tabs for calibration. The drawbacks of requiring individual meter adjustment after assembly, a compensating coil, and limiting restoring force to a preset fixed direction lead to expensive assemblies and limited meter designs.

SUMMARY OF THE INVENTION

It is therefore an object of the invention to provide a meter with a return-to-zero feature which requires no adjustment after assembly or any individual adjustment.

It is a further object of the invention to provide a method of manufacture of a meter having an accurate return-to-zero magnet requiring no individual adjustment.

The invention is carried out by an air core gauge having a bobbin defining a central cavity, an armature secured to the bobbin for rotation about an axis including a disc magnet in the cavity, an indicating pointer controlled by the armature, an annular biasing magnet fixed to the bobbin coaxially with the armature and magnetized in a predetermined direction to bias the disc magnet to a preset angular position, coils wound around the bobbin, and means for supplying current to the coils to energize the gauge, whereby the biasing magnet determines the gauge indication in the absence of coil current.

The method of the invention is carried out by manufacturing a return-to-zero gauge assembly having a pair of bobbin portions including armature journals, an annular biasing magnet, a magnetized armature, and coils comprising the steps of assembling an annular blank for the biasing magnet to one of the bobbin portions concentrically with a journal, and establishing a magnetizing field across the blank and its associated bobbin portion to magnetize the blank in a predetermined direction parallel to a diameter of the blank to form the biasing magnet, with the optional step of assembling the bobbin portions, the armature, and the coils prior to the magnetizing step to armature.

BRIEF DESCRIPTION OF THE DRAWINGS

The above and other advantages of the invention will become more apparent from the following description taken in conjunction with the accompanying drawings wherein like reference numerals refer to like parts and wherein.

DESCRIPTION OF THE PREFERRED EMBODIMENT

Figure 1:
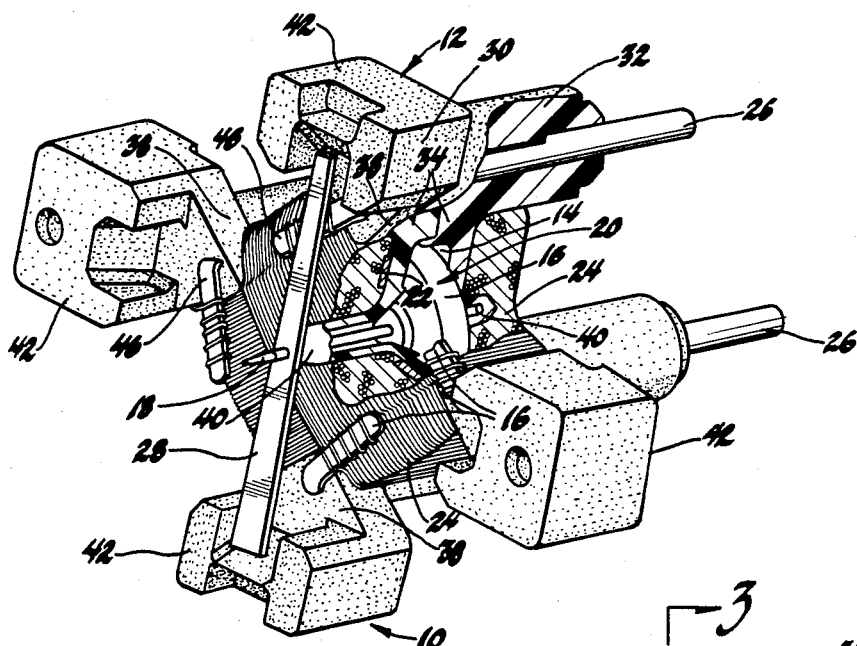
FIG. 1 is a partly broken away isometric view of the meter according to the invention.
Figure 2:
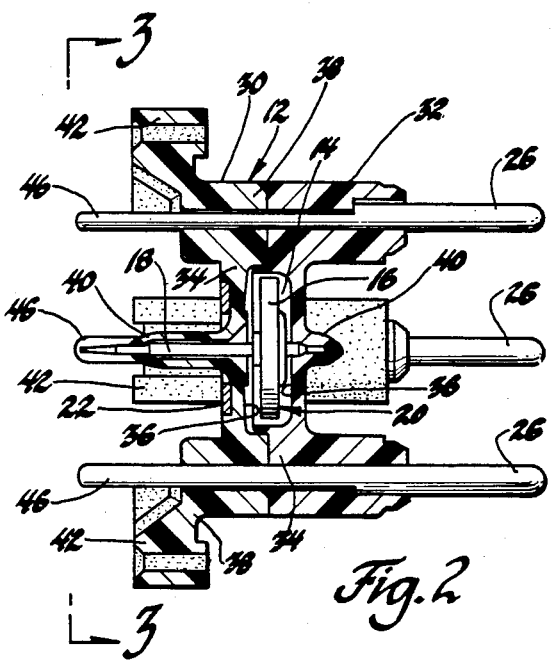
FIG. 2 is a cross-sectional view of a sub-assembly of the meter of FIG. 1.

As shown in the drawings, the meter 10 according to the invention comprises a plastic bobbin 12 defining a cavity 14 containing a disc magnet 16 carried by a shaft 18 to form an armature 20 which is journaled in the bobbin, an annular biasing magnet 22 on the bobbin 12, coils 24 wound around the bobbin 12, four terminals 26 secured to the bobbin 12 and connected electrically to the coils 24, and a pointer 28 secured to an end of the shaft 18 which extends beyond the bobbin 12. The disc magnet 16 is a permanent magnet which is magnetized in the direction of a diameter of the disc.

The bobbin 12 is made of first and second complementary portions 30 and 32, each having a circular central portion 34 containing a recess 36 for defining the cavity 14 when the portions are mated. Four axially disposed posts 38 extend from the periphery of the central portions 34 of each bobbin portion 30, 32 to form lateral support for the coils 24. The terminals 26 extend axially through the posts to form connectors for the meter 10. Central hubs 40 protruding outwardly from each central portion 34 are apertured to serve as journals for the shaft 18. The first bobbin portion 30 has mounting lugs 42 extending radially outwardly from the posts 38 for securing the meter to a mounting surface and an indicator dial, not shown.

Many of the features described above are commonly used in air core gauges for instrument panel displays in automotive vehicles. In operation the coils carry current in response to the value of a parameter being measured to establish a magnetic field directed parallel to a diameter of the disc magnet 16. The disc magnet will align with the field to move the pointer 28 and provide a meter indication.

Figure 3:
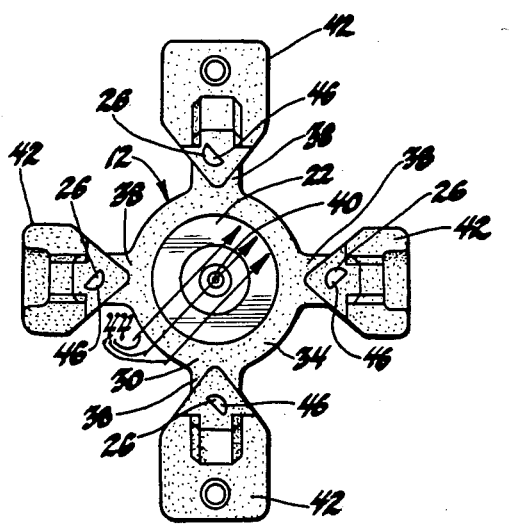
FIG. 3 is an end view of the sub-assembly of FIG. 2 taken along lines 3—3.
Figure 4:
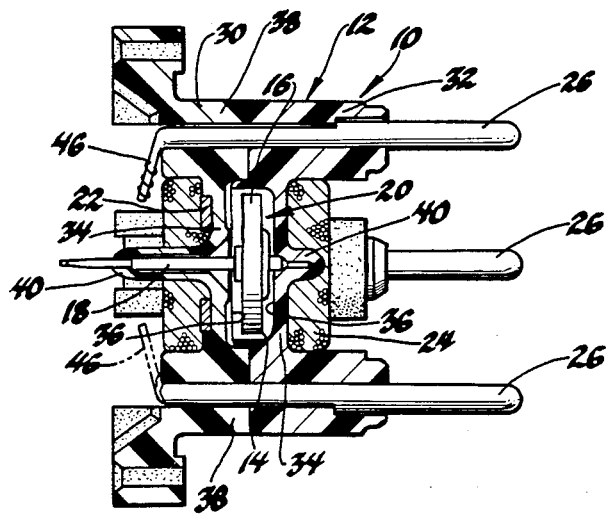
FIG. 4 is a cross-sectional view of the completed assembly of the meter according to the invention.

The biasing magnet 22 is a new feature of the subject meter and comprises an annulus of magnet material, preferably a polymer bonded ferrite, positioned on the outer surface of the first bobbin portion 30 concentric with the hub 40 and thus concentric with the shaft 18 and the disc magnet 16. In the course of meter design the preferred direction and strength of the biasing magnet 22 field is determined. Typically a magnet 0.75 mm thick having inner and outer diameters of 4.9 mm and 10 mm, respectively, has been successfully used. To precisely control the field of the biasing magnet 22, a blank of substantially non-magnetized material is fixed to the first bobbin portion by adhesive prior to bobbin assembly. Then the blank and the first bobbin portion are exposed to a magnetizing field 44 in the prescribed direction, as shown in FIG. 3, to accurately establish the biasing field direction relative to the bobbin structure. For the magnetizing step, the blank/bobbin portion sub-assembly is held in a fixture which can rotate to precisely position the blank in the magnetizing field. A magnetizing force $H_{ci} = 10,000$ oersteds is applied to the blank to form the magnet 22. The magnet strength is controlled by complete saturation of the magnet during charging. Typical magnet values are: residual induction $B_r = 1700$ gauss, coercive force $H_c = 1550$ oersteds and maximum energy product $B_d H_d = 0.75$ megagauss-oersteds. After magnetizing the bias magnet 22, the armature 20 and the second bobbin portion 32 are assembled to the first portion 30 and the terminals 26 and coils 24 are added. The ends 46 of the terminals 26 are bent over and connected to the ends of the coils 24.

An alternative method of manufacture of the gauge starts with both the annular blank and the armature in an unmagnetized condition and assembling them with the bobbin portions and winding the coils before applying the magnetizing field. Then the biasing magnet and the armature are formed simultaneously by the magnetizing field. The pointer is then added with the coils energized by a predetermined current.

It will be seen that the method of forming a biasing magnet during assembly of a gauge allows the magnet direction to be accurately determined, even in mass production, so that individual adjustment or adjustment after assembly is not required, and that any direction of magnetic field can be chosen. It will also be apparent that such a meter with a return-to-zero feature can be made with low additional cost because of the inexpensive bias magnet material and the lack of individual adjustments.

The embodiments of the invention in which an exclusive property or privilege is claimed are defined as follows:

1. The method of manufacturing a return-to-zero gauge assembly having a pair of bobbin portions, an armature journal in each portion, an annular biasing magnet, a magnetized armature, and coils comprising the steps of;
   assembling an annular blank for the biasing magnet to one of the bobbin portions concentrically with a journal, and
   establishing a magnetizing field across the blank and its associated bobbin portion to magnetize the blank in a predetermined direction parallel to a diameter of the blank to form the biasing magnet.

2. The method of manufacturing a return-to-zero gauge assembly having a pair of bobbin portions, an armature journal in each portion, an annular biasing magnet, a magnetized armature, and coils comprising the steps of;
   assembling an annular blank for the biasing magnet to one of the bobbin portions concentrically with a journal,
   establishing a magnetizing field across the blank and its associated bobbin portion to magnetize the blank in a predetermined direction parallel to a diameter of the blank to form the biasing magnet,
   then, after the biasing magnet is formed, assembling the armature to the bobbin portions, and
   winding the coils around the assembled bobbin portions.

3. The method of manufacturing a return-to-zero gauge assembly having a pair of bobbin portions, an armature journal in each portion, an annular biasing magnet concentric with an armature journal, a magnetized armature, and coils comprising the steps of;
   assembling an annular blank for the biasing magnet and an unmagnetized armature to the bobbin portions,
   winding the coils around the assembled bobbin portions, and
   establishing a magnetizing field across the assembly to simultaneously magnetize the blank and the armature in a predetermined direction parallel to a diameter of the blank and of the armature to form the biasing magnet and the armature.

* * * * *